(12) United States Patent
Lan et al.

(10) Patent No.: US 11,302,580 B2
(45) Date of Patent: Apr. 12, 2022

(54) NANOSHEET THICKNESS

(71) Applicant: Taiwan Semiconductor Manufacturing Co., Ltd., Hsin-Chu (TW)

(72) Inventors: Wen-Ting Lan, Hsinchu (TW); Kuan-Ting Pan, Hsinchu (TW); Shi Ning Ju, Hsinchu (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/888,380

(22) Filed: May 29, 2020

(65) Prior Publication Data

US 2021/0375859 A1    Dec. 2, 2021

(51) Int. Cl.
*H01L 21/8234* (2006.01)
*H01L 21/762* (2006.01)
*H01L 21/8238* (2006.01)
*H01L 29/423* (2006.01)
*H01L 29/66* (2006.01)
(Continued)

(52) U.S. Cl.
CPC ........ *H01L 21/823431* (2013.01); *H01L 21/30625* (2013.01); *H01L 21/3212* (2013.01); *H01L 21/76224* (2013.01); *H01L 21/823481* (2013.01); *H01L 21/823807* (2013.01); *H01L 29/0673* (2013.01); *H01L 29/42392* (2013.01); *H01L 29/66439* (2013.01);
(Continued)

(58) Field of Classification Search
CPC .......... H01L 29/42392; H01L 29/0673; H01L 29/78696; H01L 29/66439; H01L 29/775; H01L 29/66795; H01L 29/785–7851; H01L 29/0649; H01L 21/823807; H01L 21/823412; H01L 21/823431; H01L 21/823821; H01L 21/30625; H01L 21/3212; H01L 21/76224; H01L 21/823481; H01L 21/823878; H01L 27/0886; H01L 27/1211; H01L 27/0924
See application file for complete search history.

(56) References Cited

U.S. PATENT DOCUMENTS 8,796,666 B1   8/2014   Huang et al.
8,815,712 B2   8/2014   Wan et al.
(Continued)

*Primary Examiner* — Errol V Fernandes
*Assistant Examiner* — Jeremy J Joy
(74) *Attorney, Agent, or Firm* — Haynes and Boone, LLP

(57) ABSTRACT

According to one example, a method includes performing a Chemical Mechanical Polishing (CMP) process on a semiconductor workpiece that includes a nanosheet region, the nanosheet region having alternating layers of a first type of semiconductor material and a second type of semiconductor material. The method further includes stopping the CMP process when the first type of semiconductor material is covered by the second type of semiconductor material, patterning the nanosheet region to form nanosheet stacks, forming an isolation structure around the nanosheet stacks, removing a top layer of the second type of semiconductor material from the nanosheet stacks, recessing the isolation structure, and forming a gate structure over the nanosheet stacks.

20 Claims, 15 Drawing Sheets

(51) Int. Cl.
- *H01L 29/786* (2006.01)
- *H01L 21/306* (2006.01)
- *H01L 29/06* (2006.01)
- *H01L 21/321* (2006.01)
- *H01L 27/088* (2006.01)
- *H01L 29/78* (2006.01)

(52) U.S. Cl.
CPC .... *H01L 29/66795* (2013.01); *H01L 27/0886* (2013.01); *H01L 29/7851* (2013.01); *H01L 29/78696* (2013.01)

(56) References Cited

U.S. PATENT DOCUMENTS

| | | | |
|---|---|---|---|
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 10,332,881 | B1* | 6/2019 | Badaroglu ......... H01L 27/0207 |
| 2012/0007052 | A1* | 1/2012 | Hobbs ............. H01L 21/823821 257/24 |
| 2013/0285116 | A1 | 10/2013 | Lochtefeld et al. |
| 2015/0228480 | A1* | 8/2015 | Yin .................. H01L 29/42392 438/283 |
| 2016/0163810 | A1* | 6/2016 | Huang ............. H01L 29/42356 257/329 |
| 2017/0104061 | A1* | 4/2017 | Peng ................ H01L 29/42392 |
| 2017/0133459 | A1* | 5/2017 | Pranatharthiharan ...................... H01L 27/0886 |
| 2017/0140933 | A1* | 5/2017 | Lee .................... H01L 29/0649 |
| 2017/0278842 | A1* | 9/2017 | Song ............. H01L 21/823431 |
| 2018/0151452 | A1* | 5/2018 | Doornbos ......... H01L 29/66469 |
| 2018/0366375 | A1* | 12/2018 | Chen ............. H01L 29/66439 |
| 2019/0214473 | A1* | 7/2019 | Xie ............... H01L 21/823431 |
| 2019/0355724 | A1* | 11/2019 | Chiang ............... H01L 21/324 |
| 2020/0006577 | A1* | 1/2020 | Ching ............. H01L 29/42392 |
| 2020/0020692 | A1* | 1/2020 | Ching ................. H01L 29/785 |
| 2020/0043926 | A1* | 2/2020 | Ohtou .................. B82Y 10/00 |
| 2020/0091151 | A1* | 3/2020 | Chiang ............... H01L 29/775 |
| 2020/0098879 | A1* | 3/2020 | Lee ................... H01L 21/0262 |
| 2020/0135729 | A1* | 4/2020 | Ng .................. H01L 29/42392 |
| 2020/0365704 | A1* | 11/2020 | Chung .............. H01L 29/0665 |
| 2021/0057541 | A1* | 2/2021 | Huang ............. H01L 29/66545 |

\* cited by examiner

NANOSHEET THICKNESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
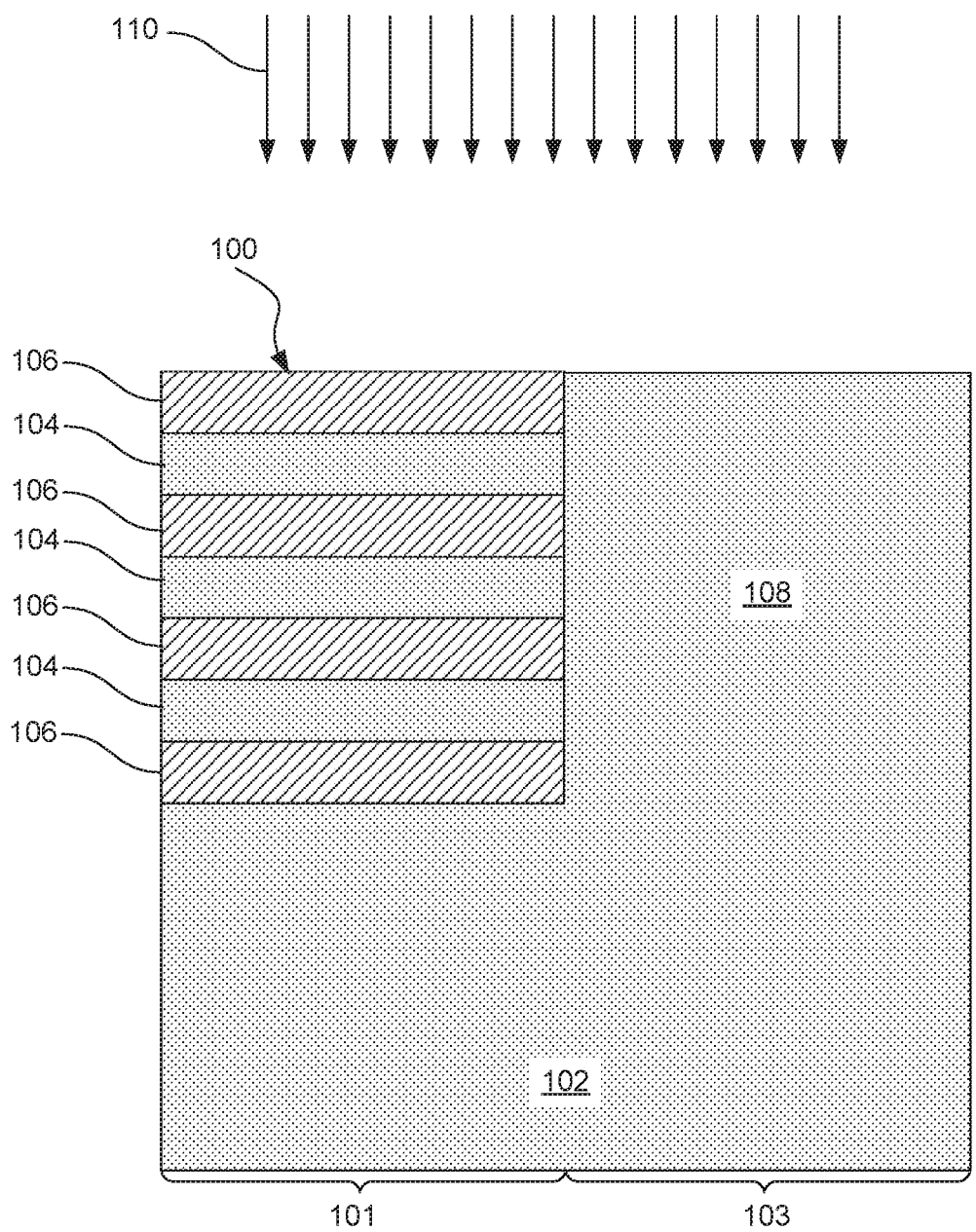
FIGS. 1A, 1B, 1C, 1D, 1E, 1F, 1G, 1H, and 1I are diagrams showing an illustrative process for achieving more uniform thickness in nanosheet devices, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In some example embodiments, to form a GAA device, a semiconductor fin may include a total of three to ten alternating layers of semiconductor materials; of course, the present disclosure is not limited to such configuration. In the present disclosure, the first semiconductor material includes Si, while the second semiconductor material includes SiGe. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

In many embodiments, alternating layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of material that may be selectively etched. For example, a first type of semiconductor material may be epitaxially grown within a space formed between two active regions. Then, a second type of semiconductor material may be epitaxially grown. The process continues by forming alternating layers of the first and second semiconductor material. Then, a first etching process (e.g., a dry etching process) is used to cut the channel stack and expose each layer of the channel stack. Then, a second etching process (e.g., a wet etching process) can be used to remove the second semiconductor material while leaving the first semiconductor material substantially intact. The remaining second semiconductor material may thus form a stack of nanowires or nanosheets extending between two active regions.

In conventional fabrication techniques, a CMP process is applied to expose the material in a layer that will ultimately be patterned to form the top nanosheet device in a nanosheet stack. However, the CMP process may potentially damage the top nanosheet device or product a different thickness, leading to less effective device performance. One solution would be to apply the CMP process such that the sacrificial material covers the top layer of material that will form the top nanosheet in the stack. However, because that sacrificial material will be removed during the gate formation process of the nanosheet stack, there will be a void on top that will adversely affect subsequently formed layers.

According to principles described herein, the CMP process used to planarize the workpiece stops when the second semiconductor material (sacrificial material) is exposed. Thus, the CMP process does not touch the top nanosheet of the nanostack. After the CMP process, but before a subsequent gate replacement process, the top layer of the sacrificial material in the nanostack is removed. The lower layers of sacrificial material are exposed.

FIGS. 1A, 1B, 1C, 1D, 1E, 1F, 1G, 1H, and 1I are diagrams showing an illustrative process for achieving more uniform thickness in nanosheet devices. FIG. 1A is a diagram showing a cross-sectional view of an illustrative workpiece 100. The workpiece includes a semiconductor substrate 102. The substrate includes a first region 101 and a second region 103. In the present example, nanosheet stacks are to be formed in the first region 101 and finFET devices are to be formed in the second region. Thus, the first region 101 may also be referred to as the nanosheet region and the second region 103 may also be referred to as the finFET region.

The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

In the first region 101, the workpiece includes alternating layers of a first type of semiconductor material 104 (sometimes referred to as a channel material) and a second type of semiconductor material 106 (sometimes referred to as a sacrificial material). In one example, the first type of semiconductor material 104 may be silicon and the second type of semiconductor material may be silicon germanium. In the present example, the first type of semiconductor material 104 is to become channel regions of a nanosheet device. The second type of semiconductor material 106 is a sacrificial layer that will ultimately be removed to form GAA nanosheet devices. In some examples, where the second type of semiconductor material is silicon germanium, the germanium concentration may be about 20% greater in the top sacrificial material layer 106 than the lower sacrificial material layers. In some examples, the germanium percentage may be within a range of about 15-25% greater in the top sacrificial material layer 106 than the lower sacrificial material layers. This may be done to help aid the selectivity of the etching process used to remove the top layer of the sacrificial material 106, which will be described in further detail below.

In the second region 103, the workpiece includes a semiconductor layer 108 comprising the first type of semiconductor material 104. Continuing the example above where the first type of semiconductor material 104 is silicon, then the semiconductor layer 108 comprises silicon. The second region will ultimately be patterned to include fin structures that are used for finFET devices.

FIG. 1A also illustrates a CMP process 110 to planarize a top surface of the workpiece 100. A CMP process involves applying a slurry to the surface of the workpiece. The slurry includes etching chemicals as well as solid particles. A polishing head is then moved across the surface of the workpiece and the chemical and mechanical forces on the workpiece result in removing material from the workpiece at a substantially similar rate so as to create a planar surface. According to principles described herein, the CMP process is applied such that it stops when the second type of semiconductor material 106 is exposed as shown in FIG. 1A. In other words, the CMP process 110 stops when the sacrificial material is exposed. This is different than conventional methods in which the CMP process stops when the material used for the channel (i.e., the first type semiconductor materials 104) is exposed. However, doing so may cause damage to the top nanosheet that will be patterned from that top layer 104.

Figure 1B:
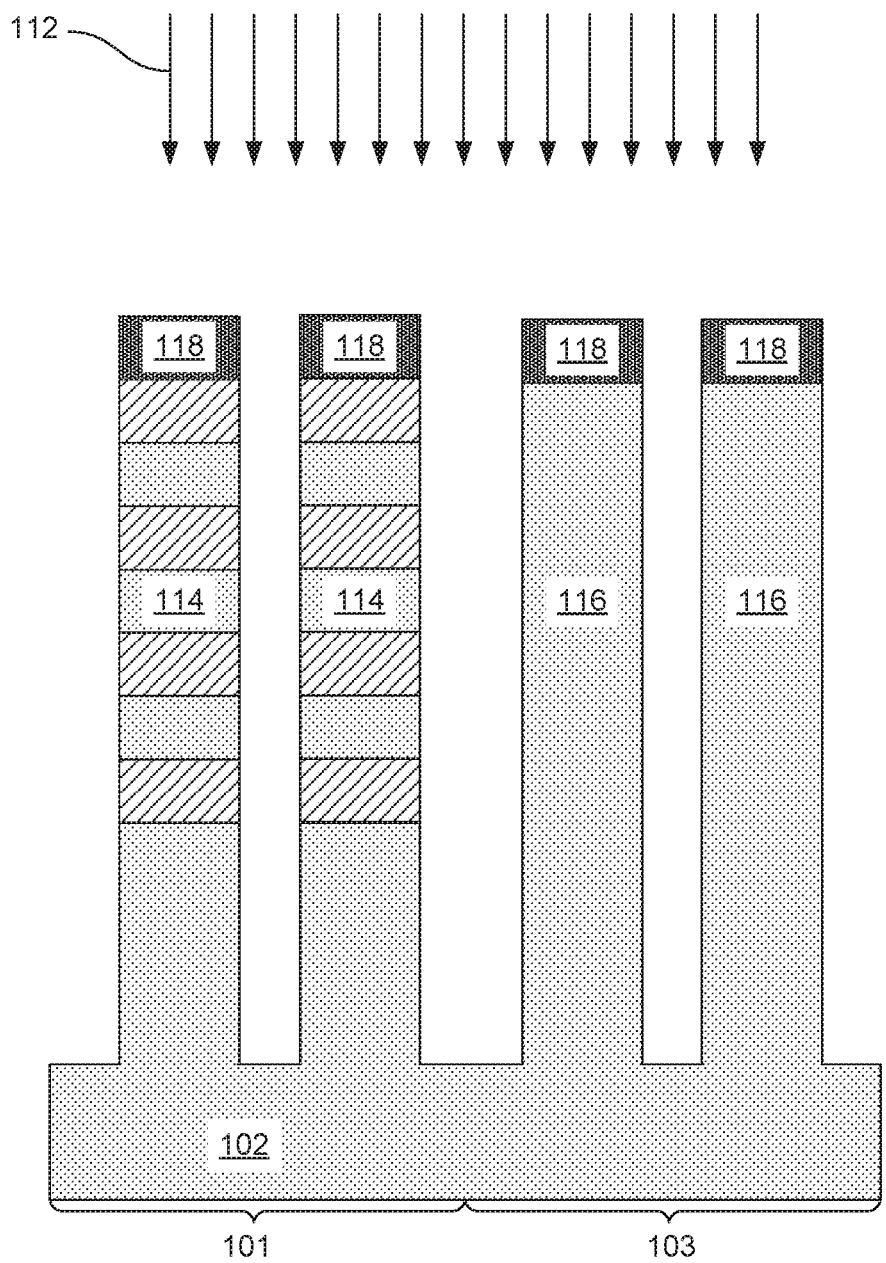

FIG. 1B illustrates a patterning process 112 to pattern both the first region 101 and the second region 103. The first region 101 and the second region 103 may be patterned using a photolithographic process. For example, a hard mask layer 118 and a photoresist layer may be deposited onto the workpiece 100. The hardmask layer 118 may include at least one of silicon oxide (SiO2), silicon nitride (SiN), silicon carbide (SiC), silicon oxynitride (SiON), silicon oxycarbide (SiOC), hafnium oxide (HfO2), aluminum oxide (Al2O3), and zirconium oxide (ZrO2). Other materials are contemplated. The photoresist may then be exposed to a light source through a photomask. The photoresist may then be developed such that the portions of the photoresist remain while other portions are removed. In some examples, both the first region 101 and the second region 103 are patterned in the same photolithographic process. In some examples, the first region 101 and the second region 103 are formed in different processes. In such case, the second region 103 may be covered while the first region 101 is patterned. Then, the first region 101 may be covered while the second region 103 is patterned.

The patterning process 112 may utilize a dry etching process. A dry etching process is an anisotropic process that removes material in a single direction. After the patterning process 112, there are nanosheet stacks 114 in the first region 101 and fin structures 116 in the second region 103. The patterning process 112 is configured such that the etching process removes material from the substrate. Thus, a bottom portion of the nanosheet stacks includes the substrate material, which may be silicon, and an upper portion of the nanosheet stacks 114 includes alternating layers of the first type semiconductor material 104 and the second type of semiconductor material 106.

Figure 1C:
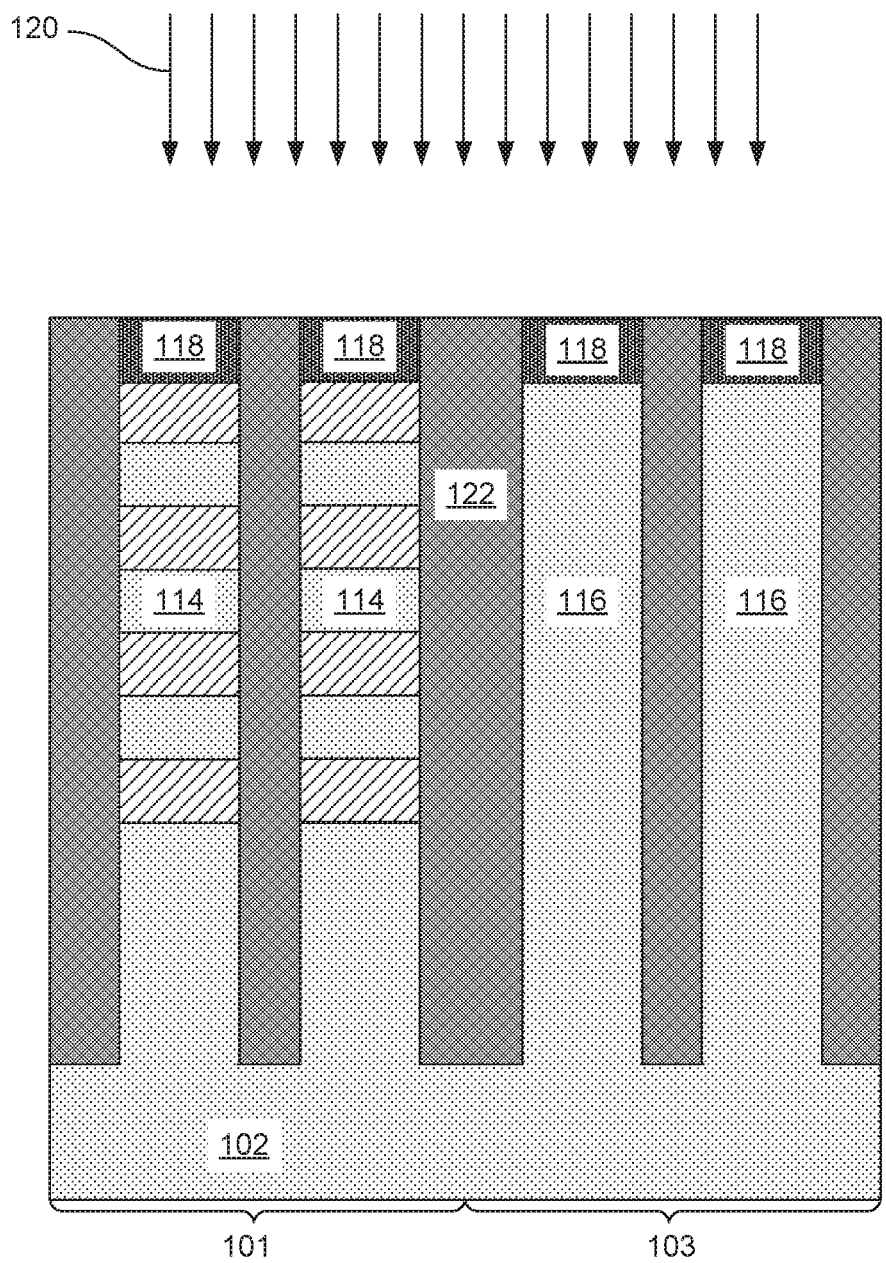

FIG. 1C illustrates a Shallow Trench Isolation (STI) layer 122 formation process 120. According to the present example, an STI layer is deposited to encompass the nanosheet stacks 114 and the fin structures 116. The STI layer 122 may be a dielectric material that is used to electrically isolate one device from another. After the STI material is deposited, a CMP process is applied to planarize the top surface of the workpiece such that the hard mask layer 118 is exposed.

Figure 1D:
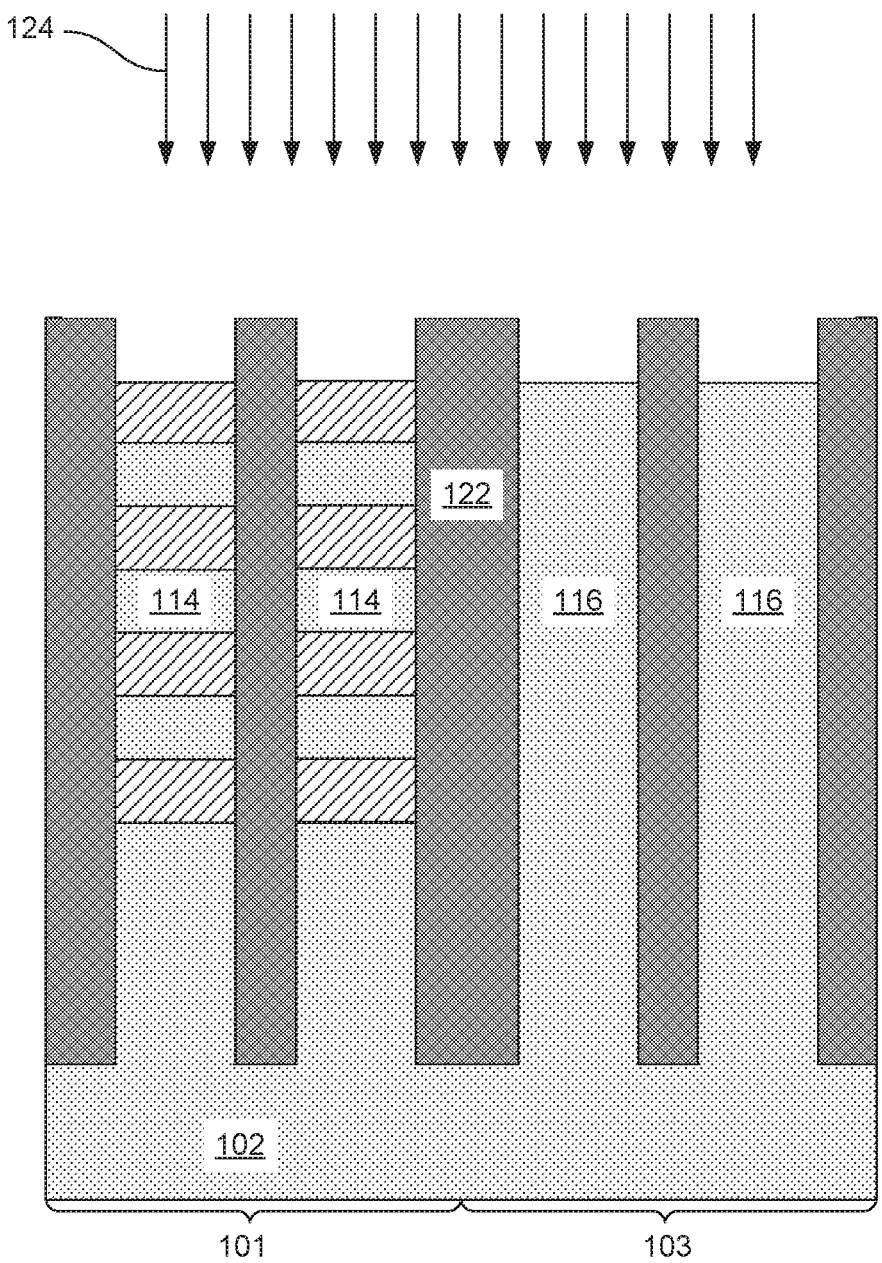

FIG. 1D illustrates a removal process 124 to remove the hardmask layer. The removal process 124 may involve an etching process such as a wet etching process. A wet etching process is isotropic and thus removes material in all directions. The wet etching process may be designed with a selectivity such that it removes the hard mask layer while having little effect on the STI layer 122, the nanosheet stacks 114, and the fin structures 116. The wet etching process may use an acid-based etchant such as: sulfuric acid (H2SO4), perchloric acid (HClO4), hydroiodic acid (HI), hydrobromic acid (HBr), nitric acid (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH).

Figure 1E:
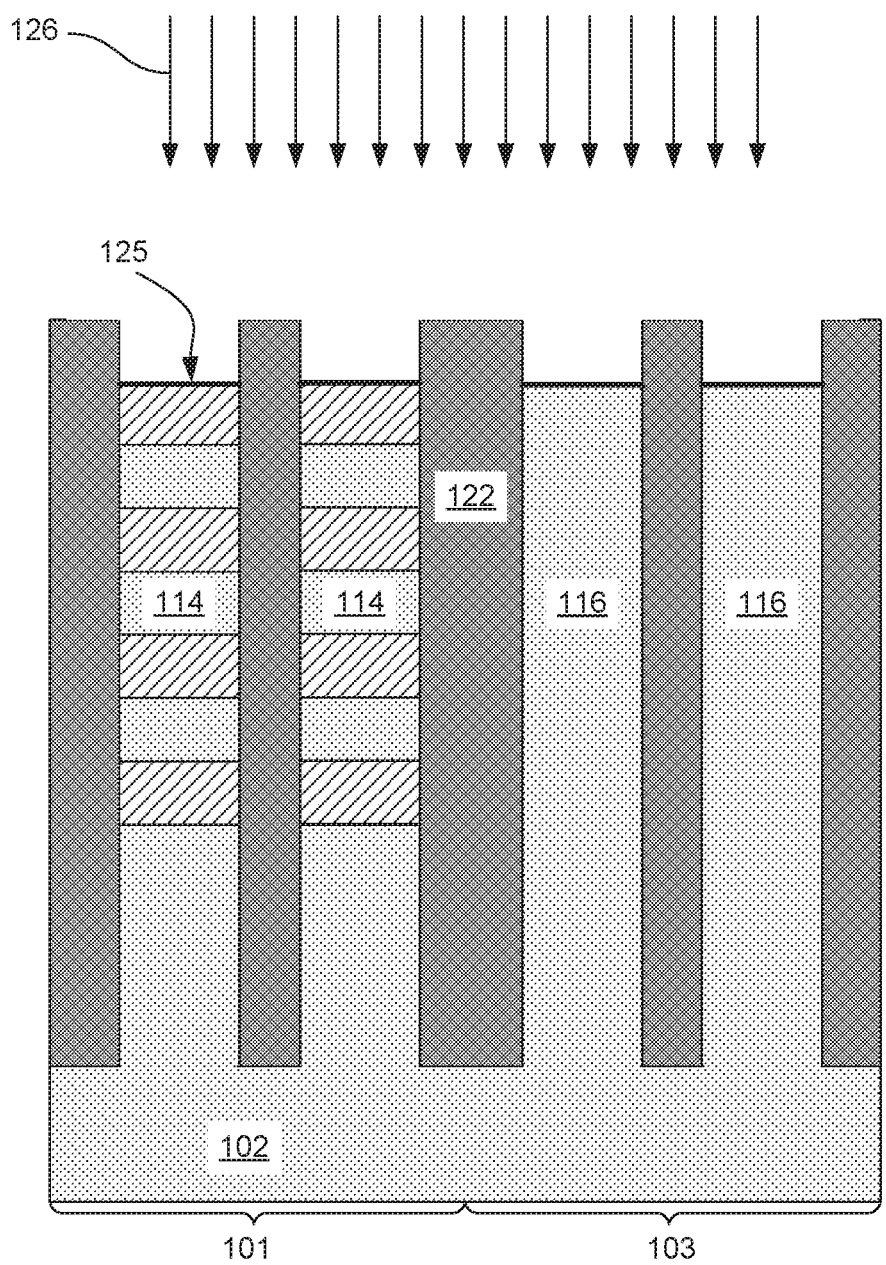

FIG. 1E illustrates a removal process 126 of a PAD layer 125 that may be positioned between the top surface of the nanosheet stacks 114 and the hard mask layer 118. The PAD layer 125 may also be positioned between the top surface of the fin structures 116 and the hard mask layer. The PAD layer 125 may be, for example, a silicon nitride layer. A different etching process 126 than the process 124 used to remove the hard mask may be used to remove the PAD layer.

Figure 1F:
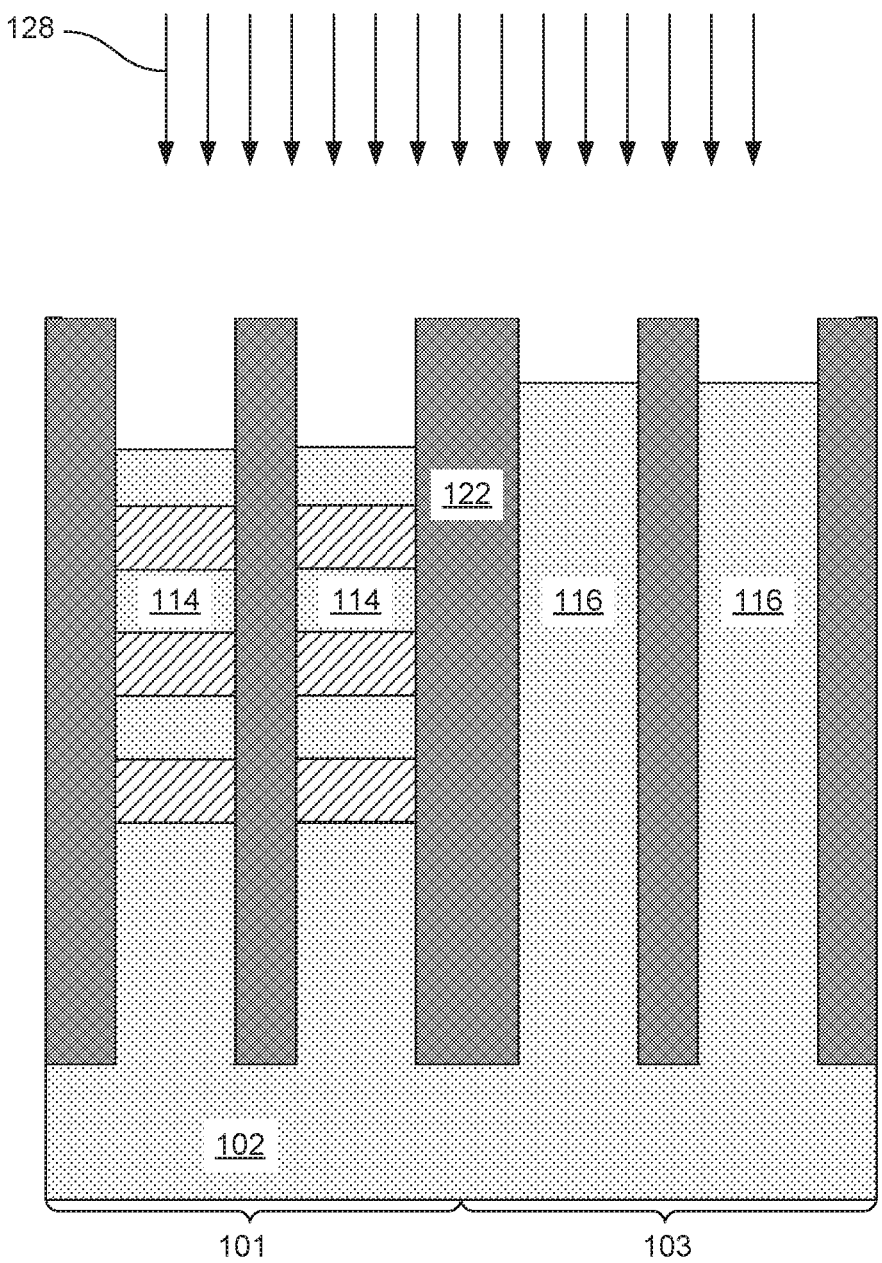

FIG. 1F illustrates a removal process 128 to remove the top layer of the second type semiconductor material 106 from the nanostacks 114. The removal process 128 may be a wet etching process. The removal process 128 may be designed with a selectivity such that the second type semiconductor material 106 is removed while the first type semiconductor material and the STI material remains substantially intact. Removing the top layer of the second type semiconductor material exposes a top surface of the first type semiconductor material 104. Removing the top layer of the sacrificial material at this stage is beneficial. Even though this material is going to be removed during the gate replacement process, it is advantageous to remove the top layer earlier because it allows the subsequently formed layers to have better contact the top surface of top nanosheet and prevent a void.

Figure 1G:
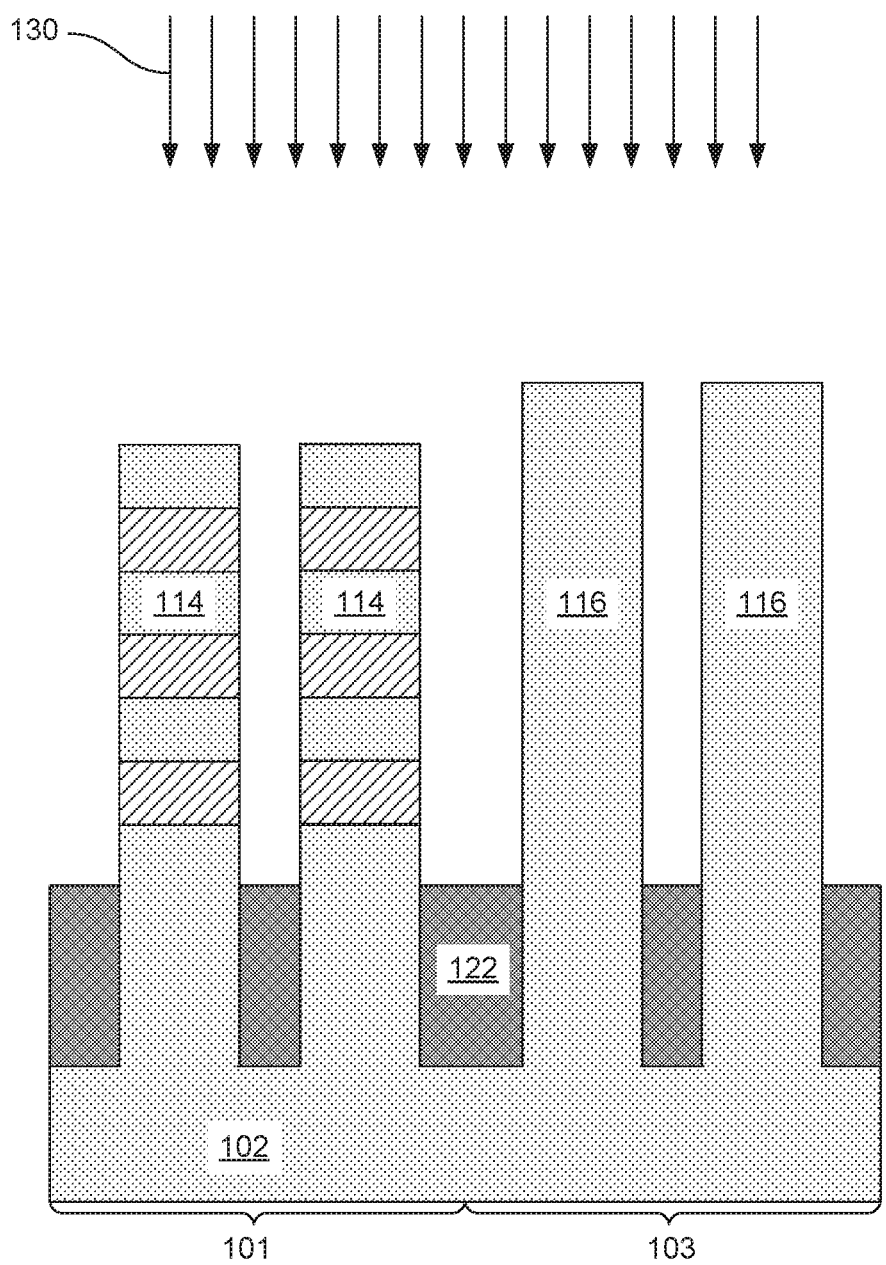

FIG. 1G illustrates an etching process 130 to recess the STI layer 122. This etching process 130 may be designed with a selectivity such that the nanostacks 114 and fin structures 116 remain substantially intact while the STI layer is recessed. The STI layer 122 is recessed until it is below a bottom surface of the bottom second type semiconductor material layer 106. In some examples, the etching process 130 used to recess the STI and the process 128 used to remove the top sacrificial material may be tuned together in a certain way to achieve various profiles for the top nanosheet in the nanostacks 114. More detail on this concept will be discussed below in the text accompanying FIGS. 3A, 3B, and 3C.

Figure 1H:
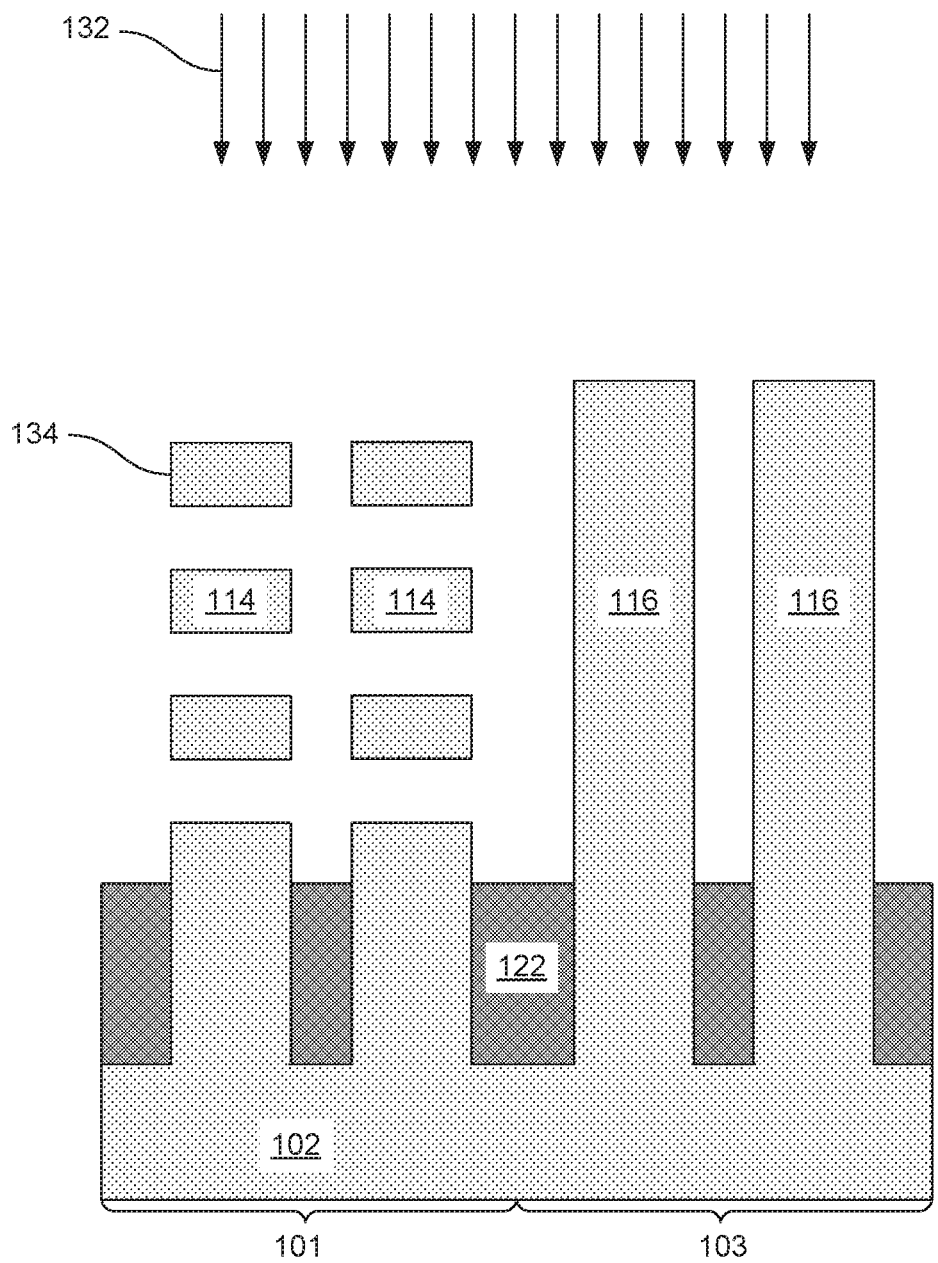

FIG. 1H illustrates a removal process 132 to remove the sacrificial material 106 from the nanostacks 114 and leave nanosheets 134 remaining. This may be done as part of a gate replacement process. In a gate replacement process, a dummy gate structure is formed over both the nanostacks 114 and the fin structures. After the dummy gate structure is formed, sidewall structures are then formed on both sides of the gate structure. Then, source/drain regions can be formed within the fin structures and within certain portions of the nanostack region 101. After the source/drain regions are formed, the dummy gate structure may be removed. This removal process exposes the nanostacks and thus exposes the sacrificial material (second type semiconductor material 106) for removal.

The removal process 132 may be a wet etching process. The removal process 132 may be designed with a selectivity such that the sacrificial material (second type semiconductor material 106) is removed while the fin structures 116 and the nanosheets 134 remain substantially intact. After the nanosheets 134 are exposed on all sides, the real gate structure may be formed. The real gate structure may be, for example, a metal gate structure. Before the metal gate structure is applied, a high-k dielectric layer (not shown) may be deposited all around the nanosheets. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

And, a workfunction layer (not shown) may be deposited all around the nanosheets 134. The workfunction layer may be a workfunction metal. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). The high-k dielectric layer and workfunction metals may also be formed over the fin structures.

Figure 1I:
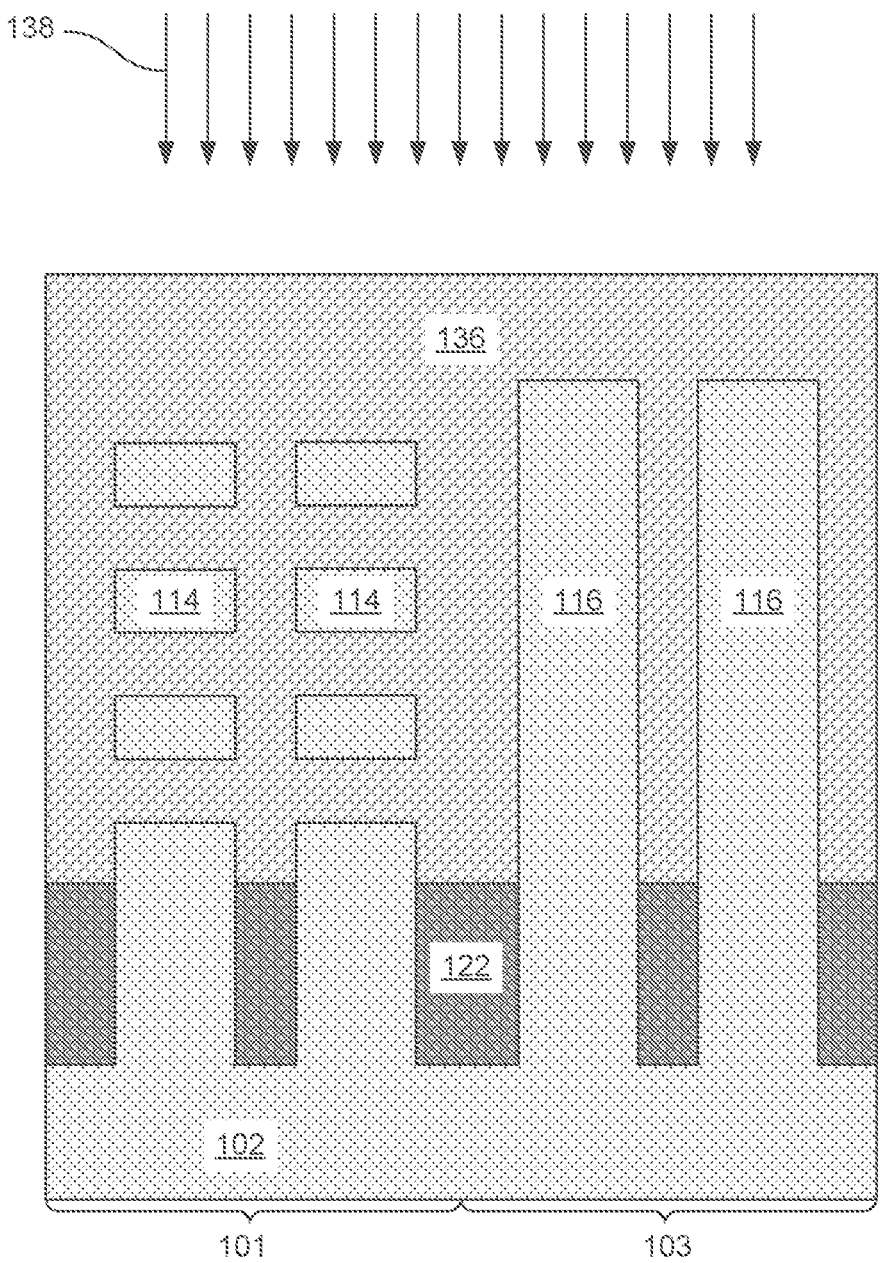

FIG. 1I is a diagram showing a gate formation process 138 to form a gate structure 136 around the nanosheets 134 and over the fin structures 116. The gate structure 136 may be a real gate structure that replaces a dummy gate structure. The real gate structure 136 may be, for example, a metal gate structure. The gate structure may be formed by depositing a metal material and then patterning the metal material to form the gate structure 136.

Figure 2:
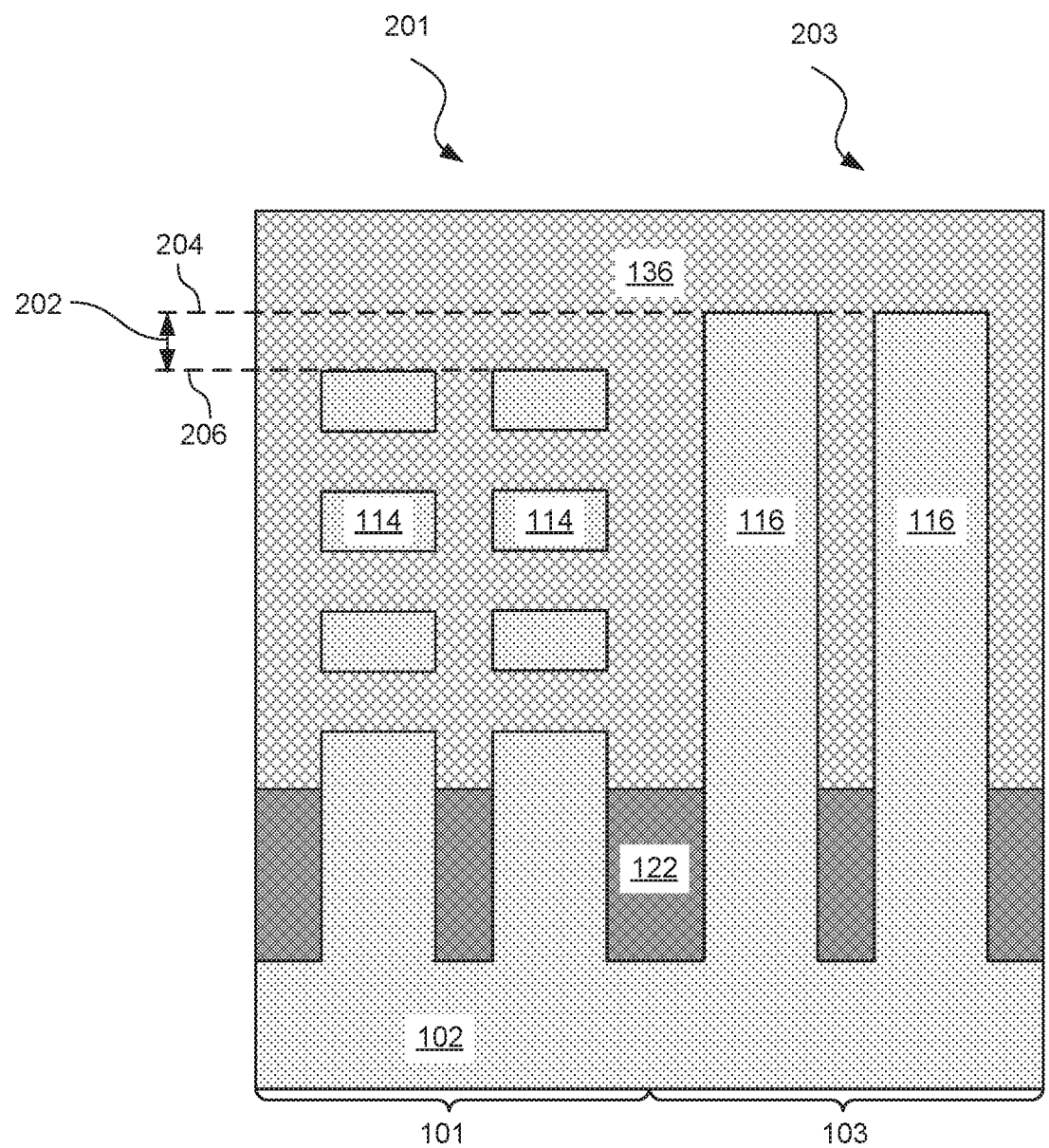
FIG. 2 is a diagram showing characteristics of a device formed using the method illustrated in FIGS. 1A-1I, according to one example of principles described herein.

FIG. 2 is a diagram showing characteristics of a device formed using the method illustrated in FIGS. 1A-1I. FIG. 2 shows the structure of nanosheet devices 201 and finFET devices 203. In the present example, there is a distance 202 between the top surface 204 of the fin structures 116 and the top surface 206 of the top nanosheet in one of the nanostack devices 201. Said differently, the height of the fin structures is greater than the height of the nanosheet stacks. The distance 202 may be within a range of about 0-6 nanometers. While in the present example, the fin structures have a greater height than the nanosheet stacks 114, the reverse may also be possible. In other words, the nanosheets may have a greater height than the fin structures 116.

In some examples, the nanosheet devices 201 may be core devices and the finFET devices 203 may be Input/Output (I/O) devices. The nanosheet devices 201 may be either n-type of p-type devices. Similarly, the finFET devices 203 may be either n-type or p-type transistors.

Figure 3A:
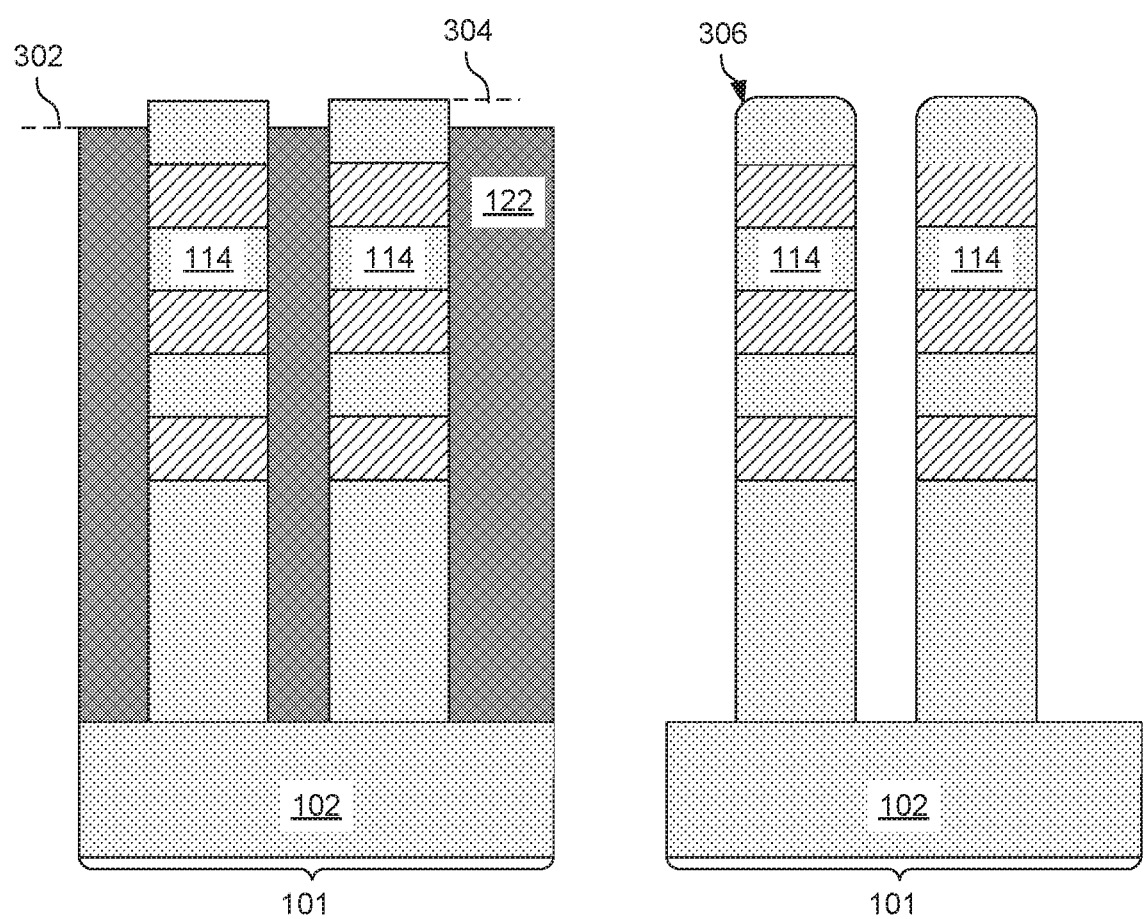
FIGS. 3A, 3B, and 3C are diagrams showing illustrative processes for forming various nanosheet profiles, according to one example of principles described herein.
Figure 3B:
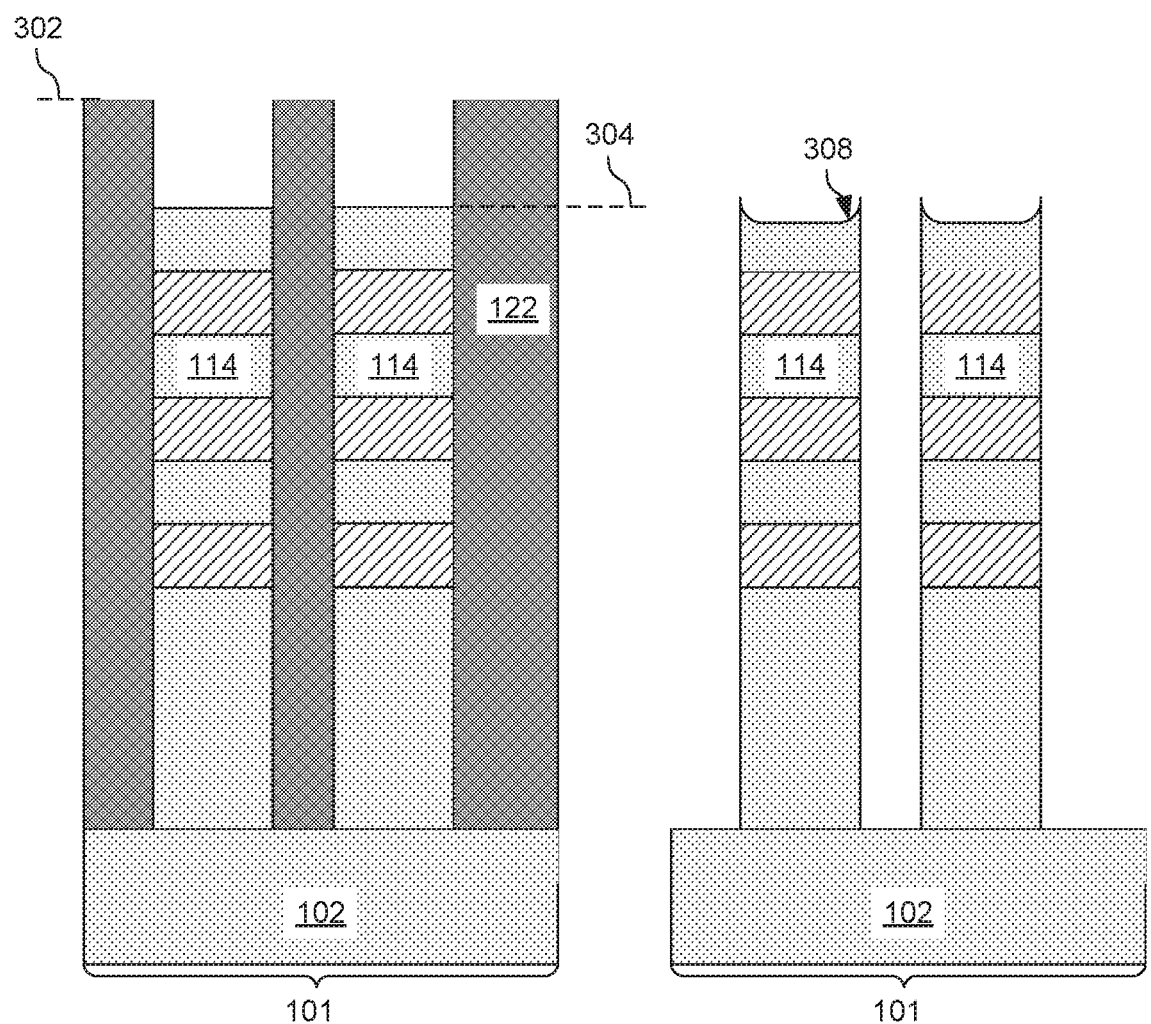
Figure 3C:
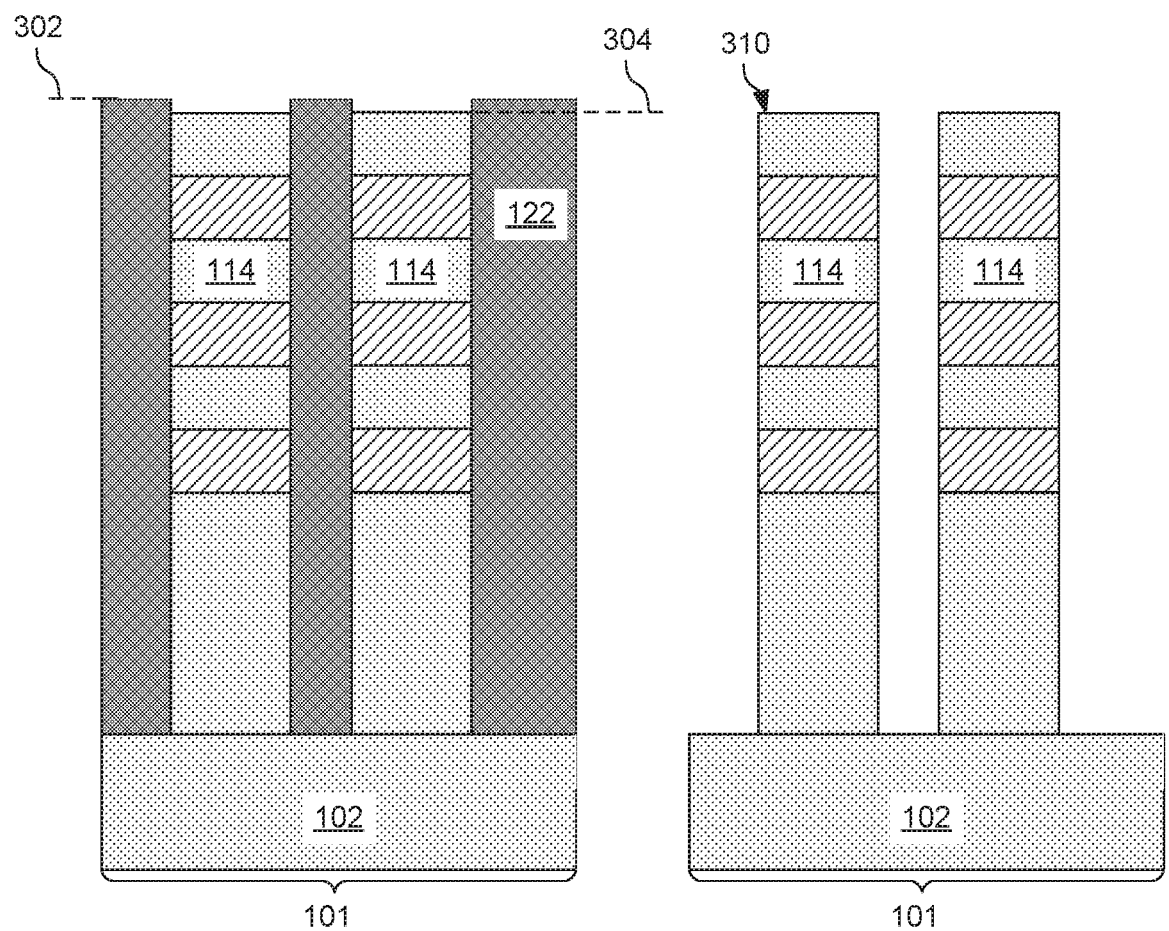

FIGS. 3A, 3B, and 3C are diagrams showing illustrative processes for forming various nanosheet profiles. Specifically, the profile for the top nanosheet may be tuned by adjusting the STI height before the top sacrificial material layer from the nanostack is removed. FIG. 3A illustrates an example in which the STI 122 is first recessed to a height 302 that is lower than a top surface 304 of the nanosheet. Doing so results in a rounded profile 360 of the top nanosheet. The height of the STI layer 122 may be adjusted before the top sacrificial material layer 106 is removed. This adjustment may be made by using an etching process similar to the etching process 130 that will later be used to fully recess the STI 122 to expose the entire nanostack.

FIG. 3B illustrates an example in which the top surface 302 of the STI is higher than a top surface 304 of the top nanosheet. This results in a horned profile 308 as shown. FIG. 3C shows an example. In this example, no recessing of the STI 122 may occur before the top sacrificial material layer 106 is removed. In some examples, the STI 122 may be slightly recessed, but only such that the height of the STI is still substantially higher than the top surface of the top nanosheet.

FIG. 3C illustrates an example in which the top surface 302 of the STI is substantially similar to the top surface 304 of the top nanosheet. The height of the STI layer 122 may be adjusted before the top sacrificial material layer 106 is removed. In the present example, surface 302 is only slightly higher than surface 304. This configuration results in a substantially square profile 310. In some cases, the substantially square profile 310 may be ideal. However, the other profiles may have various benefits in other situations as well.

Figure 4:
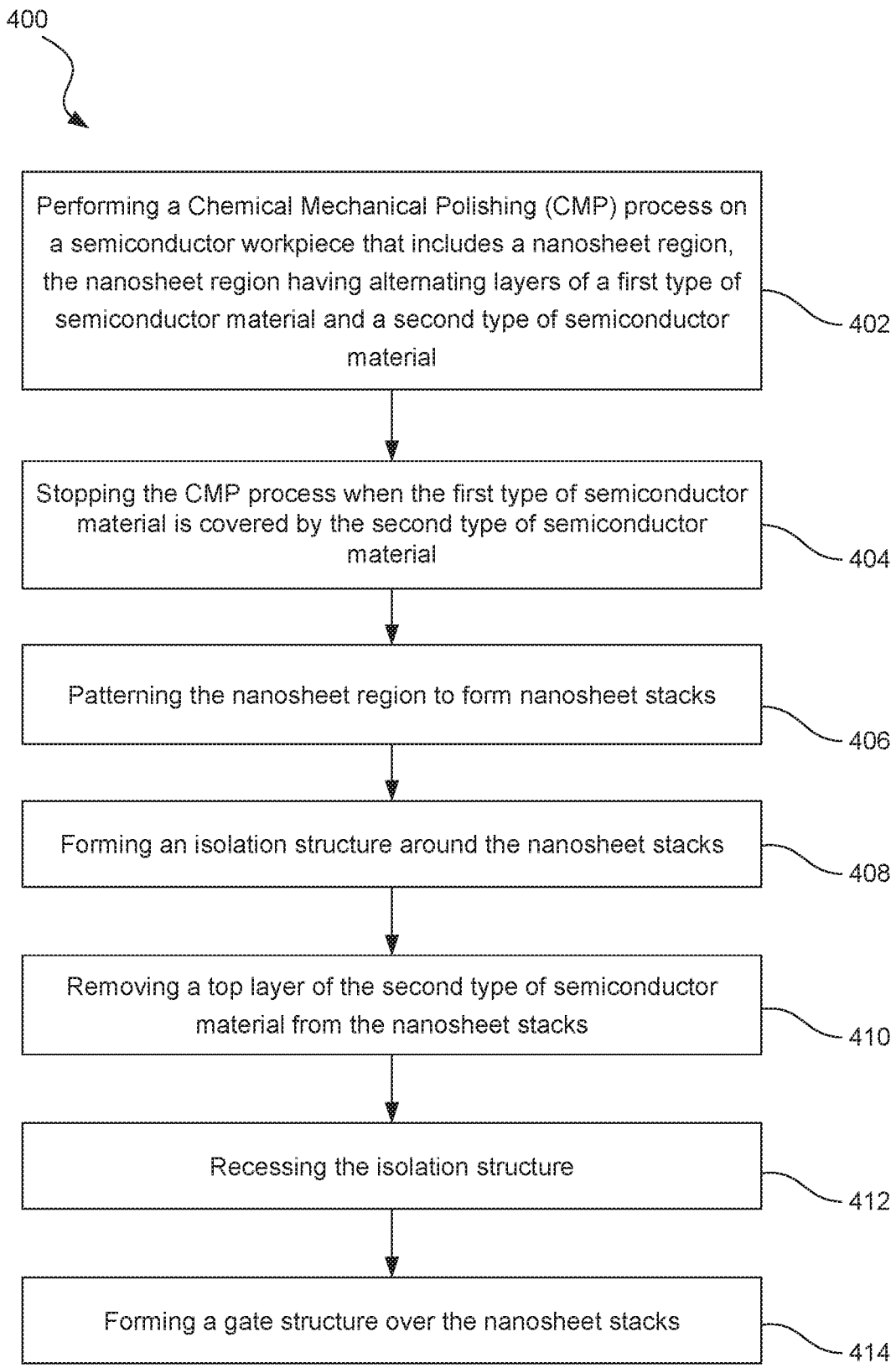
FIG. 4 is a flowchart showing an illustrative method for forming a nanosheet device with more uniform thickness, according to one example of principles described herein.

FIG. 4 is a flowchart showing an illustrative method for forming a nanosheet device with more uniform thickness. According to the present example, the method 400 includes a process 402 for performing a Chemical Mechanical Polishing (CMP) process (e.g., 110) on a semiconductor workpiece (e.g., 100) that includes a nanosheet region (e.g. 101). The nanosheet region has alternating layers of a first type of semiconductor material (e.g., 104) and a second type of semiconductor material (e.g., 106). In one example, the first type of semiconductor material 104 may be silicon and the second type of semiconductor material may be silicon germanium. In the present example, the first type of semiconductor material is to become channel regions of a nanosheet device. The second type of semiconductor material is a sacrificial layer that will ultimately be removed to form GAA nanosheet devices. In some examples, where the second type of semiconductor material is silicon germanium, the germanium concentration may be about 20% greater in the top sacrificial material layer than the lower sacrificial material layers. In some examples, the germanium percentage may be within a range of about 15-25% greater in the top sacrificial material layer 106 than the lower sacrificial material layers. This may be done to help aid the selectivity of the etching process used to remove the top layer of the sacrificial material.

The method 400 further includes a process 404 for stopping the CMP process when the first type of semiconductor material is covered by the second type of semiconductor material. In other words, the CMP process is applied such that it stops when the second type of semiconductor material is exposed as shown in FIG. 1A. Thus, the CMP process stops when the sacrificial material is exposed. This is different than conventional methods in which the CMP process stops when the material used for the channel (i.e., the first type semiconductor materials 104) is exposed. However, doing so may cause damage to the top nanosheet that will be patterned from that top layer 104.

The method 400 further includes a process 406 for patterning the nanosheet region to form nanosheet stacks. In some examples, the second region (finFET region) may also be patterned at this time. The nanosheet region may be patterned using a photolithographic process. For example, a hard mask layer and a photoresist layer may be deposited onto the workpiece. The hardmask layer may include at least one of silicon oxide (SiO2), silicon nitride (SiN), silicon carbide (SiC), silicon oxynitride (SiON) silicon oxycarbide (SiOC), hafnium oxide (HfO2), aluminum oxide (Al2O3), and zirconium oxide (ZrO2). Other materials are contemplated. The photoresist may then be exposed to a light source through a photomask. The photoresist may then be developed such that the portions of the photoresist remain while other portions are removed.

The patterning process 112 may utilize a dry etching process. A dry etching process is an anisotropic process that removes material in a single direction. After the patterning process 112, there are nanosheet stacks 114 in the first region 101 and fin structures 116 in the second region 103. The patterning process 112 is configured such that the etching process removes material from the substrate. Thus, a bottom portion of the nanosheet stacks includes the substrate material, which may be silicon, and an upper portion of the nanosheet stacks 114 includes alternating layers of the first type semiconductor material 104 and the second type of semiconductor material 106.

The method 400 further includes a process 408 for forming an isolation structure around the nanosheet stacks. In some examples, the STI layer (e.g., 122) is deposited to encompass the nanosheet stacks 114. The STI layer may be a dielectric material that is used to electrically isolate one device from another. After the STI material is deposited, a CMP process is applied to planarize the top surface of the workpiece such that the hard mask layer is exposed.

The method 400 further includes a process 410 for removing a top layer of the second type of semiconductor material from the nanosheet stacks. The removal process (e.g., 128) may be a wet etching process. The removal process may be designed with a selectivity such that the second type semiconductor material is removed while the first type semiconductor material and the STI material remains substantially intact. Removing the top layer of the second type semiconductor material exposes a top surface of the first type semiconductor material. Removing the top layer of the sacrificial material at this stage is beneficial. Even though this material is going to be removed during the gate replacement process, it is advantageous to remove the top layer earlier because it allows the subsequently formed layers to have better contact the top surface of top nanosheet and prevent a void. Before the top layer of the second type of semiconductor material is removed from the nanostacks, the hardmask layer (e.g., 118) may be removed.

The method further includes a process 412 for recessing the isolation structure. This etching process 130 may be designed with a selectivity such that the nanostacks remain substantially intact while the STI layer is recessed. The STI layer is recessed until it is below a bottom surface of the bottom second type semiconductor material layer. In some examples, the etching process (e.g., 130) used to recess the STI and the process (e.g., 128) used to remove the top sacrificial material may be tuned together in a certain way to achieve various profiles for the top nanosheet in the nanostacks, as illustrated in FIGS. 3A, 3B, and 3C.

The method further includes a process 414 for forming a gate structure over the nanosheet stacks. This may involve first forming a dummy gate and replacing that dummy gate with a real gate. Specifically, in such a gate replacement process, a dummy gate structure is formed over both the nano stacks and the fin structures. After the dummy gate structure is formed, sidewall structures are then formed on both sides of the gate structure. Then, source/drain regions can be formed within the fin structures and within certain portions of the nanostack region. After the source/drain regions are formed, the dummy gate structure may be removed. This removal process exposes the nanostacks and thus exposes the sacrificial material (second type semiconductor material 106 for removal in a further removing process (e.g., 132).

Before the metal gate structure is formed, a high-k dielectric layer may be deposited all around the nanosheets. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

And, a workfunction layer may be deposited all around the nanosheets 134. The workfunction layer may be a workfunction metal. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). The high-k dielectric layer and workfunction metals may also be formed over the fin structures.

Figure 5:
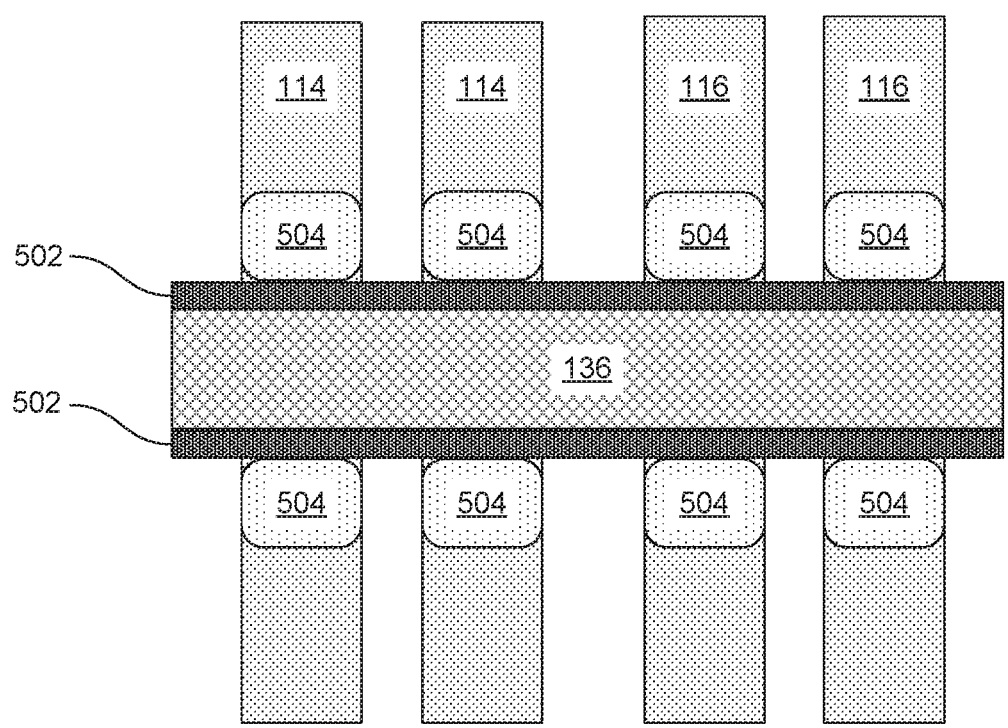
FIG. 5 is a diagram showing an illustrative top view of the nanosheets, according to one example of principles described herein.

FIG. 5 is a diagram showing an illustrative top view of the nanostacks 114 and the fin structures 116. FIG. 5 also illustrates the metal gate 136. The metal gate includes an inner spacer 502 on both sides of the gate 136. From the top view, the source/drain features 504 may be seen within the nanostacks 114 and the fin structures 116. In some examples, the source/drain features 504 may be formed through an epitaxial growth process.

By applying principles described herein, nanostructures may be formed so that the top nanosheet is less prone to damage and may have a more precisely tuned profile. And, by removing the top sacrificial layer before the dummy gate replacement process, there will be no void or gap above the top nanosheet device. Thus, the device will exhibit better performance.

According to one example, a method includes performing a Chemical Mechanical Polishing (CMP) process on a semiconductor workpiece that includes a nanosheet region, the nanosheet region having alternating layers of a first type of semiconductor material and a second type of semiconductor material. The method further includes stopping the CMP process when the first type of semiconductor material is covered by the second type of semiconductor material, patterning the nanosheet region to form nanosheet stacks, forming an isolation structure around the nanosheet stacks, removing a top layer of the second type of semiconductor material from the nanosheet stacks, recessing the isolation structure, and forming a gate structure over the nanosheet stacks.

According to one example, a method includes providing a semiconductor workpiece with a nanosheet region and a finFET region, the nanosheet region comprising alternating layers of a first type of semiconductor material and a second type of semiconductor material, the finFET region comprising the first type of semiconductor material. The method further includes polishing a top surface of the workpiece and stopping while the second type of semiconductor material is at the top surface, patterning the nanosheet region and the finFET region to form nanosheet stacks and fin structures, after forming an isolation structure around the nanosheet stacks, removing a top layer of the second type of semiconductor material, and forming a gate structure over the nanosheet stacks and the fin structures.

According to one example, a semiconductor device includes a first region comprising a plurality of nanosheet stacks, each of the nanosheet stacks having a plurality of nanosheets surrounded by a gate structure. The device further includes a second region comprising a plurality of fin structures, each of the fin structures surrounded by the gate structure. Top surfaces of top nanosheets of the plurality of nano sheets are offset from top surfaces of the fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a nanosheet region on a semiconductor workpiece, the nanosheet region having alternating layers of a first type of semiconductor material and a second type of semiconductor material, a top layer of the first type of semiconductor material being covered by a top layer of the second type of semiconductor material;
    patterning the nanosheet region to form nanosheet stacks;
    forming an isolation structure around the nanosheet stacks;
    removing the top layer of the second type of semiconductor material from the nanosheet stacks;
    after the removing of the top layer of the second type of semiconductor material, recessing the isolation structure; and
    forming a gate structure over the nanosheet stacks.

2. The method of claim 1, wherein the first type of semiconductor material corresponds to a channel of a semiconductor device.

3. The method of claim 1, wherein the second type of semiconductor material is a sacrificial material that is removed during a process to form the gate structure.

4. The method of claim 1, wherein the first type of semiconductor material comprises silicon and the second type of semiconductor material comprises silicon germanium.

5. The method of claim 1, wherein the workpiece further includes a finFET region adjacent the nanosheet region.

6. The method of claim 5, further comprising: while patterning the nanosheet region, patterning the finFET region to form fin structures.

7. The method of claim 6, wherein the fin structures comprise the first type of semiconductor material.

8. The method of claim 5, wherein devices within the finFET region correspond to Input/Output (I/O) devices and devices within the nanosheet region correspond to core devices.

9. The method of claim 5, wherein the fin structures have a different height than the nanosheet stacks after the removing the top layer of the second type of semiconductor material.

10. The method of claim 5, further comprising:
performing a Chemical Mechanical Polishing (CMP) process on the nanosheet region and the finFET region to planarize the semiconductor workpiece, wherein after the performing of the CMP process, the top layer of the first type of semiconductor material remains covered by the second type of semiconductor material.

11. The method of claim 2, wherein after the recessing of the isolation structure, a top surface of the isolation structure is below a bottom surface of a bottommost layer of the first type of semiconductor material.

12. A method comprising:
providing a semiconductor workpiece with a nanosheet region and a finFET region, the nanosheet region comprising alternating layers of a first type of semiconductor material and a second type of semiconductor material, the finFET region comprising the first type of semiconductor material;
polishing a top surface of the workpiece and stopping while the second type of semiconductor material is at the top surface;
patterning the nanosheet region and the finFET region to form nanosheet stacks and fin structures;
after forming an isolation structure around the nanosheet stacks, removing a top layer of the second type of semiconductor material;
after removing the top layer of the second type of semiconductor material, recessing the isolation structure; and
forming a gate structure over the nanosheet stacks and the fin structures.

13. The method of claim 12, wherein a ratio of germanium to silicon in the top layer of the second type semiconductor layer is greater than for lower layers of the second type semiconductor material.

14. The method of claim 13, wherein the concentration of germanium is within about 0-20 percent greater in the top layer of the second type semiconductor layer than for lower layers of the second type semiconductor material.

15. The method of claim 12, wherein removing the top layer of the second type semiconductor material comprises an etching process.

16. The method of claim 15, wherein the etching process is applied in concert with a process for recessing the isolation structure to create a rounded nanosheet at a top of the nanosheet stack.

17. The method of claim 15, wherein the etching process is applied in concert with a process for recessing the isolation structure to create a horned nanosheet at a top of the nanosheet stack.

18. The method of claim 15, wherein the etching process is applied in concert with a process for recessing the isolation structure to create a squared nanosheet at a top of the nanosheet stack.

19. A method, comprising:
receiving a workpiece including a nanosheet region, the nanosheet region having alternating layers of a first type of semiconductor material and a second type of semiconductor material;
performing a Chemical Mechanical Polishing (CMP) process, the CMP process leaving a top layer of the second type of semiconductor material exposed on a top surface of the workpiece;
patterning the nanosheet region to form nanosheet stacks;
forming an isolation structure around the nanosheet stacks;
removing the top layer of the second type of semiconductor material from the nanosheet stacks;
recessing the isolation structure, wherein the removing of the top layer of the second type of semiconductor material is conducted in concert with a process for the recessing of the isolation structure to create a rounded nanosheet at a top of the nanosheet stack; and
forming a gate structure over the nanosheet stacks.

20. The method of claim 19, wherein further comprising patterning a finFET region adjacent to the nanosheet region to form fin structures thereon.

* * * * *